(12) United States Patent
Lin et al.

(10) Patent No.: US 9,802,280 B2
(45) Date of Patent: *Oct. 31, 2017

(54) HEAT SINK STRUCTURE AND MANUFACTURING METHOD THEREOF

(71) Applicant: Asia Vital Components Co., Ltd., New Taipei (TW)

(72) Inventors: Sheng-Huang Lin, New Taipei (TW); Kuo-Sheng Lin, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 613 days.

This patent is subject to a terminal disclaimer.

(21) Appl. No.: 14/459,487

(22) Filed: Aug. 14, 2014

(65) Prior Publication Data

US 2014/0352150 A1 Dec. 4, 2014

Related U.S. Application Data

(62) Division of application No. 13/610,467, filed on Sep. 11, 2012, now abandoned.

(30) Foreign Application Priority Data

Aug. 1, 2012 (TW) .............................. 101127730 A

(51) Int. Cl.
*B23P 15/26* (2006.01)
*F28F 7/00* (2006.01)
(Continued)

(52) U.S. Cl.
CPC ............ *B23P 15/26* (2013.01); *B21D 39/038* (2013.01); *B21D 53/02* (2013.01); *B21K 25/00* (2013.01);
(Continued)

(58) Field of Classification Search
CPC .... B21D 39/038; B21D 53/02; B21D 53/022; B21D 53/04; B21D 53/06; B21D 53/08;
(Continued)

(56) References Cited

U.S. PATENT DOCUMENTS 9,604,328 B2* 3/2017 Lin ...................... B23P 19/027
2003/0094275 A1* 5/2003 Mochizuki ................ F28F 3/02
165/185

(Continued)

FOREIGN PATENT DOCUMENTS

CN 200947004 Y 9/2007
CN 101403492 A 4/2009
(Continued)

*Primary Examiner* — Christopher Besler
*Assistant Examiner* — Matthew P Travers
(74) *Attorney, Agent, or Firm* — C. G. Mersereau; Nikolai & Mersereau, P.A.

(57) ABSTRACT

A heat sink structure and a manufacturing method thereof. The heat sink includes a main body and multiple radiating fins each having a folded root section. The main body has multiple connection channels formed on a circumference of the main body. The multiple radiating fins are placed in a mold. A mechanical processing measure is used to high-speed impact the main body so as to thrust the main body into the mold. Accordingly, the folded root sections of the radiating fins are relatively high-speed thrust into the connection channels of the main body to tightly integrally connect with the main body.

3 Claims, 13 Drawing Sheets

(51) Int. Cl.
  *B21K 25/00* (2006.01)
  *B21D 53/02* (2006.01)
  *B21D 39/03* (2006.01)
  *B23P 11/02* (2006.01)
  *B23P 19/10* (2006.01)
  *B23P 19/027* (2006.01)
  *F21V 29/77* (2015.01)
  *H01L 21/48* (2006.01)
  *F28D 21/00* (2006.01)

(52) U.S. Cl.
  CPC ............... *F28F 7/00* (2013.01); *B23P 11/02* (2013.01); *B23P 19/027* (2013.01); *B23P 19/10* (2013.01); *B23P 2700/10* (2013.01); *F21V 29/77* (2015.01); *F28D 2021/0029* (2013.01); *H01L 21/4882* (2013.01); *Y10T 29/49378* (2015.01)

(58) Field of Classification Search
  CPC ......... Y10T 29/49377; Y10T 29/49378; Y10T 29/49384; Y10T 29/4935; Y10T 29/49895; Y10T 29/49897; Y10T 29/49945; Y10T 29/49998; B23P 2700/10; B23P 15/26; B23P 11/02; B23P 11/022; B23P 19/02; B23P 19/027; B23P 19/10; B23P 19/12; H01L 21/4882; H01L 23/3672; F21V 29/77–29/773; F28D 2021/0029; B21K 25/00
  See application file for complete search history.

(56) References Cited

U.S. PATENT DOCUMENTS

| | | | |
|---|---|---|---|
| 2005/0211416 A1* | 9/2005 | Kawabata | H01L 21/4882 165/80.3 |
| 2007/0051495 A1* | 3/2007 | Hsiao | F28F 3/02 165/80.3 |
| 2009/0025906 A1* | 1/2009 | Huang | F28D 15/0275 165/80.3 |
| 2010/0162551 A1* | 7/2010 | Chen | B21K 25/00 29/428 |
| 2010/0181046 A1* | 7/2010 | Chen | H01L 21/4878 165/80.3 |
| 2010/0257734 A1* | 10/2010 | Wei | B21D 53/02 29/890.03 |
| 2011/0197417 A1* | 8/2011 | Chin | B23P 11/00 29/428 |

FOREIGN PATENT DOCUMENTS

| | | |
|---|---|---|
| CN | 101780504 A | 7/2010 |
| TW | I343470 B1 | 6/2011 |
| TW | 098105429 | 7/2011 |
| TW | I345147 B1 | 7/2011 |

\* cited by examiner

HEAT SINK STRUCTURE AND MANUFACTURING METHOD THEREOF

CROSS-REFERENCE TO RELATED APPLICATIONS

The present application is a division of U.S. patent application Ser. No. 13/610,467, filed on Sep. 11, 2012, titled Heat Sink Structure and Manufacturing Method Thereof, listing Sheng-Huang Lin and Kuo-Sheng Lin as inventors. This application claims the priority benefit of Taiwan patent application number 101127730 filed Aug 1, 2012.

BACKGROUND OF THE INVENTION

1. Field of the Invention

The present invention relates generally to an improved heat sink structure and a manufacturing method thereof, and more particularly to an annular heat sink structure and a manufacturing method thereof.

2. Description of the Related Art

The conventional cylindrical heat sink includes a cylindrical body and multiple radiating fins connected to the circumference of the cylindrical body. There are several conventional measures for connecting the radiating fins to the circumference of the cylindrical body. For example, Taiwanese Invention Patent Application No. 098105429 discloses a cylindrical heat sink and a method of tightly planting radiating fins of the heat sink and an application device thereof. According to the method, a mold seat drivable by a power source to create stepped rotational operation is provided. A cylindrical body is located on the mold seat. The circumference of the cylindrical body is formed with multiple channels. A radiating fin assembly is provided. The radiating fin assembly includes multiple radiating fins arranged on a lateral side of the mold seat. The cylindrical body intermittently rotates to drive and align the channels with the radiating fins. A radiating fin insertion device is used to push the radiating fins and sequentially insert and locate the radiating fins into the channels of the cylindrical body. After the radiating fins are fully inserted in the channels of the cylindrical body, a successive tightening process is performed to tightly integrally connect the radiating fins to the channels. Accordingly, the radiating fins are located on the circumference of the cylindrical body to form a heat sink.

One prior art discloses a tightening method for a heat sink. The heat sink includes a heat conduction base seat and a radiating fin assembly. One surface of the base seat is formed with multiple channels and guide grooves positioned between two channels. The radiating fin assembly includes multiple radiating fins. A mold having an internal space and a press end section is provided. A tightening/connection process is performed to press and insert the heat sink into the internal space of the mold. The press end section is axially thrust into the guide grooves to compress and deform the channels. At this time, the radiating fins are pressed to tightly integrally connect with the deformed channels. The above patent provides a heat sink pressing and riveting method better than the conventional heat sink manufacturing method. The breakage of the puncher or blade mold can be effectively reduced to promote the ratio of good products. Also, the precision and quality of the products are increased. This method is conveniently applicable to various heat sinks to form different types or shapes of heat sinks.

Another prior art discloses an improved assembly of heat sink radiating fins and base seat. The end of the radiating fin of the heat sink is formed with a folded root section with a predetermined shape. Multiple radiating fins are assembled into a radiating fin assembly by means of side latches or heat pipes. The connection face of the base seat is formed with insertion channels in adaptation to the radiating fins by means of an extrusion mold. The connection face of the base seat is further formed with elongated grooves. The insertion channels and the elongated grooves are alternately arranged.

The folded root sections of the radiating fins of the radiating fin assembly are simultaneously inserted into the insertion channels of the base seat. Then the elongated grooves are pressed to make the base seat very tightly riveted with the folded root sections of the radiating fins. By means of the design of the folded root sections, the contact area between the radiating fins and the base seat is greatly increased to effectively enhance heat transfer efficiency of the heat sink. Moreover, the insertion process is simple and time-saving and the radiating fins can be securely connected with the base seat by means of the insertion process. Furthermore, the assembling process can be completed without using electroplating, solder paste or any other media adhesive. This helps in maintaining the environment.

The other prior art discloses an improved heat sink with heat pipes. The heat sink includes a thermal module, a base seat and more than one heat pipe. The end of each radiating fin is formed with a folded root section. An upper end face of the base seat is formed with multiple insertion channels by means of an extrusion mold. The folded root sections of the radiating fins are inserted into the insertion channels of the base seat and tightly riveted with the base seat. More than one insertion groove is formed on a lower end face of the base seat. The heat pipe is correspondingly placed into the insertion groove and then pressed and flattened to tightly connect with the base seat by means of press fit. Accordingly, the bottom face of the heat pipe is formed with a flat section flush with the lower end face of the base seat. The flat section of the heat pipe attaches to and contacts with a heat-generating chip. Therefore, the heat can be directly transferred by the heat pipe and quickly dissipated.

In all the above patents, the radiating fin is first riveted with the channel and then the guide grooves on two sides of the channel are pressed to deform the channel and press the radiating fin to tightly integrally connect the radiating fin with the channel.

Such process has some problems as follows:

1. The riveting process is a pressing process in which a mechanical measure is used to connect two components into an integrated body. The radiating fin is connected with the channel by means of riveting so that the junction between the radiating fin and the channel is deformed. As a result, the junction between the radiating fin and the channel is irregular and gaps exist between the radiating fin and the channel. This will affect the heat transfer efficiency.
2. The outer surface of the cylindrical body not only is formed with the channels, but also is formed with the guide grooves. The channels and the guide grooves are alternately arranged. That is, the number of the channels per unit surface area is reduced. As a result, the number of the mounted radiating fins is reduced.
3. The guide grooves on two sides of the channel are pressed to deform the channel and press the radiating fin to tightly integrally connect the radiating fin with the channel. This is likely to make the edges of the opening of the channel outward curl and warp. Therefore, the opening of the channel will be expanded. As a result, the radiating fin is apt to detach from the channel.

4. The manufacturing method includes numerous steps so that the manufacturing time is quite long.

SUMMARY OF THE INVENTION

It is therefore a primary object of the present invention to provide a heat sink structure and a manufacturing method thereof. The heat sink includes a main body and multiple radiating fins each having at least one folded root section. The main body is formed with multiple connection channels. By means of a mechanical processing measure, the folded root sections of the radiating fins are relatively high-speed thrust into the connection channels of the main body to tightly integrally connect with the main body to form the heat sink by means of press fit. Therefore, it is unnecessary to further press the junction between the main body and the radiating fins.

It is a further object of the present invention to provide the above heat sink structure, in which the junction between the main body and the radiating fins is formed with a raised/recessed non-planar surface to enhance connection friction.

It is still a further object of the present invention to provide the above heat sink structure and the manufacturing method thereof, in which the number of the radiating fins per unit surface area is increased.

It is still a further object of the present invention to provide the above heat sink structure and the manufacturing method thereof, in which the heat sink structure has better heat dissipation efficiency.

To achieve the above and other objects, the heat sink structure of the present invention includes: a main body having a first end and a second end, the first and second ends defining an axial direction, multiple connection channels being formed on a circumference of the main body; and multiple radiating fins connected to the circumference of the main body, each first radiating fin having an end formed with at least one folded root section corresponding to the connection channel, the folded root section having a certain form, a mechanical processing measure being used to high-speed impact the main body toward the radiating fins, whereby the folded root sections of the radiating fins are high-speed thrust into the connection channels from the first end to the second end of the main body in the axial direction to tightly integrally connect with the main body.

In the above heat sink structure, the end of the radiating fin is folded back onto itself, bent or waved to form the folded root section.

In the above heat sink structure, the end of the radiating fin is directly folded back onto itself to form the folded root section.

In the above heat sink structure, the folded root section is L-shaped, triangular, reverse T-shaped, curled or water drop-shaped.

In the above heat sink structure, the folded root section of the radiating fin has a thickness slightly larger than a width of the connection channel.

In the above heat sink structure, each connection channel is formed with a raised/recessed non-planar surface.

In the above heat sink structure, the connection channels are radially distributed over the circumference of the main body and the connection channels are normal to the surface of the main body or inclined to the surface of the main body by a certain angle.

In the above heat sink structure, the radiating fin is straight without bending or is formed with at least one bending angle.

The manufacturing method of the heat sink of the present invention includes steps of: providing a mold, the mold having an inner circumference, an upper surface and multiple splits, the inner circumference defining an internal space, the multiple splits being radially formed around the internal space in communication with the internal space and downward extending from the upper surface; providing multiple radiating fins, the radiating fins being placed in the splits, one radiating fin being placed in each split, an end of each radiating fin being preformed with a folded root section with a certain shape, the folded root sections protruding from the inner circumference of the mold; providing a main body, the main body having a first end and a second end, the first and second ends of the main body defining an axial direction, multiple connection channels being preformed on a circumference of the main body between the first and second ends, the first end of the main body being aimed at the internal space; and using a mechanical processing measure to high-speed impact the main body so as to thrust the main body into the internal space and move the main body relative to the multiple radiating fins, whereby the folded root sections of the radiating fins are high-speed thrust into the connection channels and moved in the axial direction to the second end to quickly tightly integrally connect with the main body.

In the above manufacturing method of the heat sink, the main body is temporarily positioned above the mold and the mechanical processing measure is an air compression apparatus for creating compressed air to thrust the main body into the internal space. A central body is disposed in the internal space in alignment with the main body.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
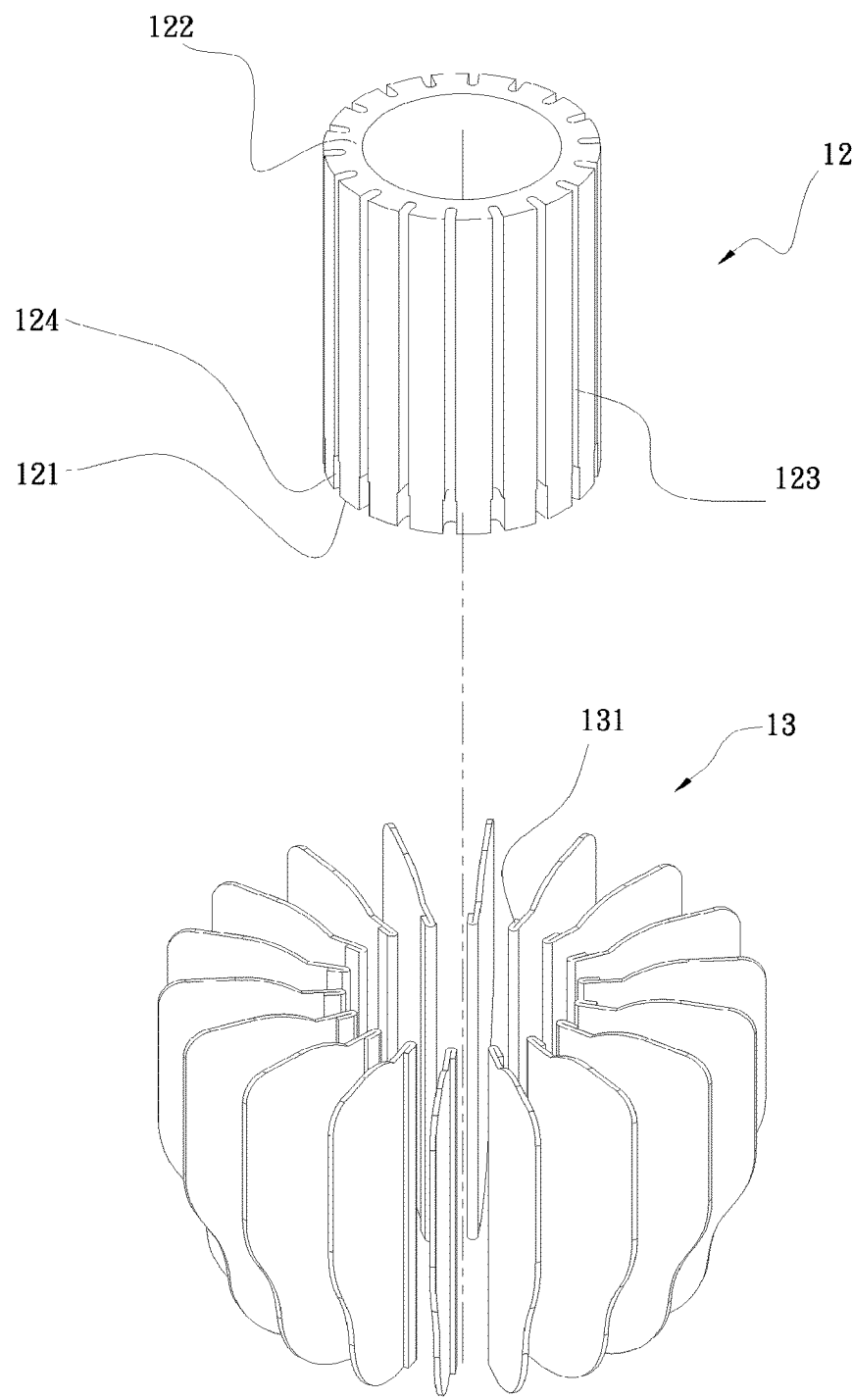
FIG. 1 is a perspective exploded view of the present invention.
Figure 2:
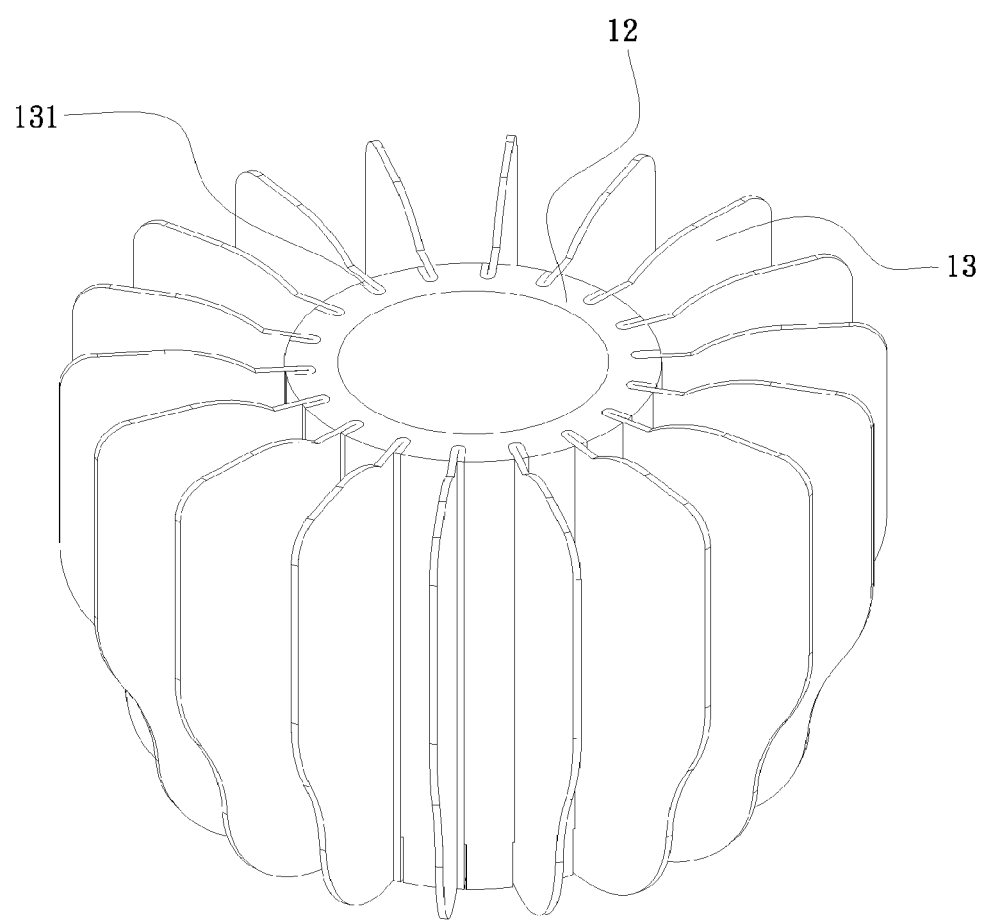
FIG. 2 is a perspective assembled view of the present invention.

Please refer to FIGS. 1 and 2. FIG. 1 is a perspective exploded view of the present invention. FIG. 2 is a perspective assembled view of the present invention. The heat sink 10 of the present invention includes a main body 12 and multiple radiating fins 13 connected to an outer circumference of the main body 12.

Figure 3A:
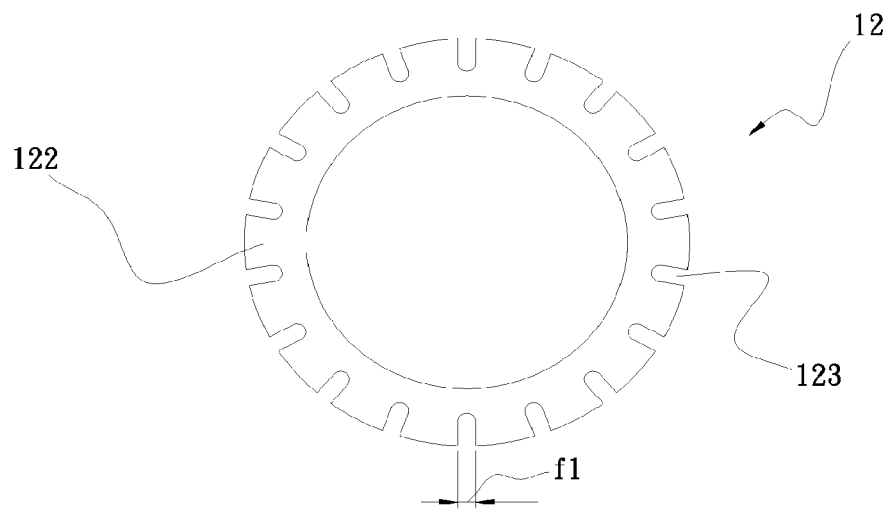
FIG. 3A is a top view of the main body of the present invention.
Figure 3B:
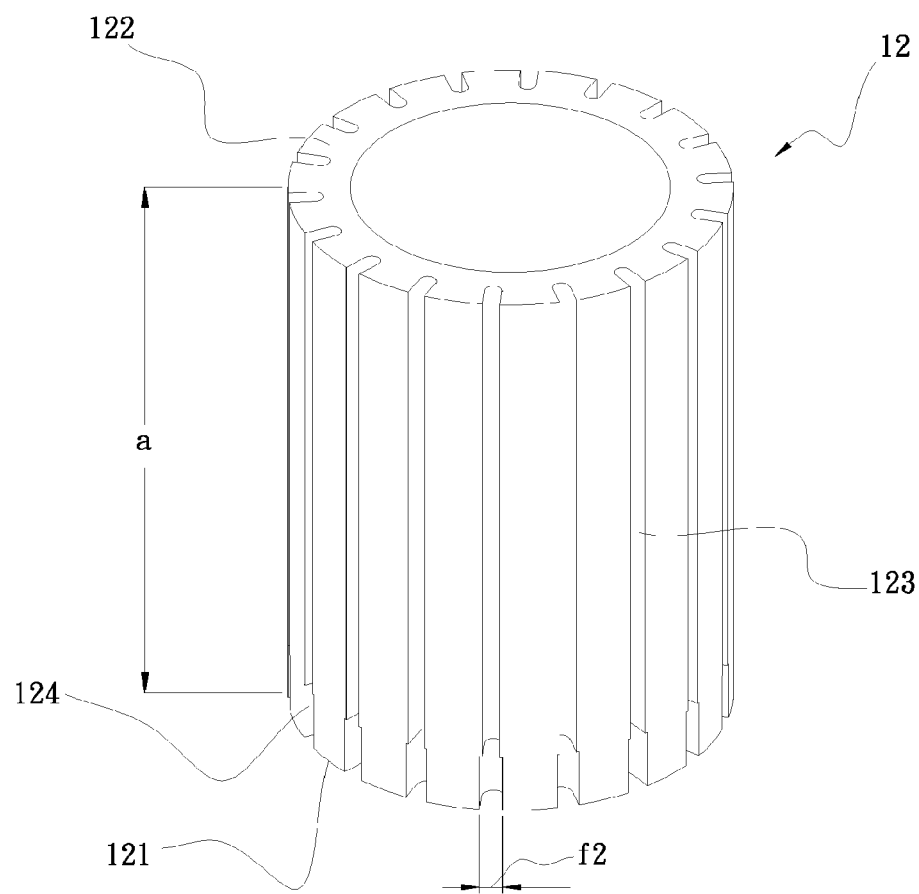
FIG. 3B is a perspective view of the main body of the present invention.

As shown in FIGS. 3A and 3B, the main body has a first end 121 and a second end 122. The first and second ends 121, 122 of the main body 12 define an axial direction. Multiple connection channels 123 are formed on the outer circumference of the main body 12 and extend from the first end 121 to the second end 122. The connection channels 123 are adapted to the radiating fins 13 (as shown in FIG. 2). The connection channels 123 are preformed on the outer circumference of the main body 12 by means of an extrusion mold or removing material (such as milling) or casting or multi-piece fit. Each connection channel 123 communicates with a thrust space 124. The thrust space 124 is formed on the outer circumference of the main body 12 near the first end 121.

Referring to FIGS. 3A and 3B, the connection channel 123 has a width f1 and the thrust space 124 has a width f2 larger than the width f1 of the connection channel 123. Accordingly, when the main body 12 is connected to the multiple radiating fins 13, the radiating fins 13 are easy to fit into the first end 121 of the main body 12 (as shown in FIG. 1).

Figure 3C:
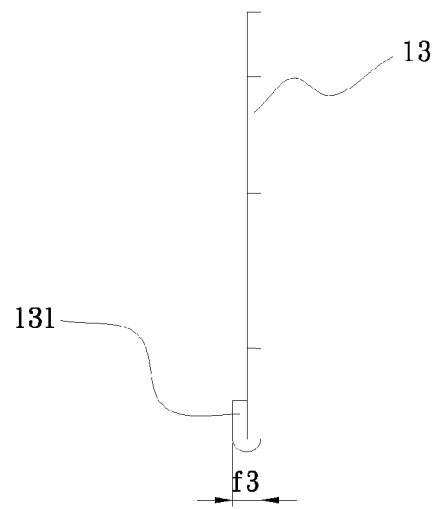
FIG. 3C is a top view of the radiating fin of the present invention.
Figure 3D:
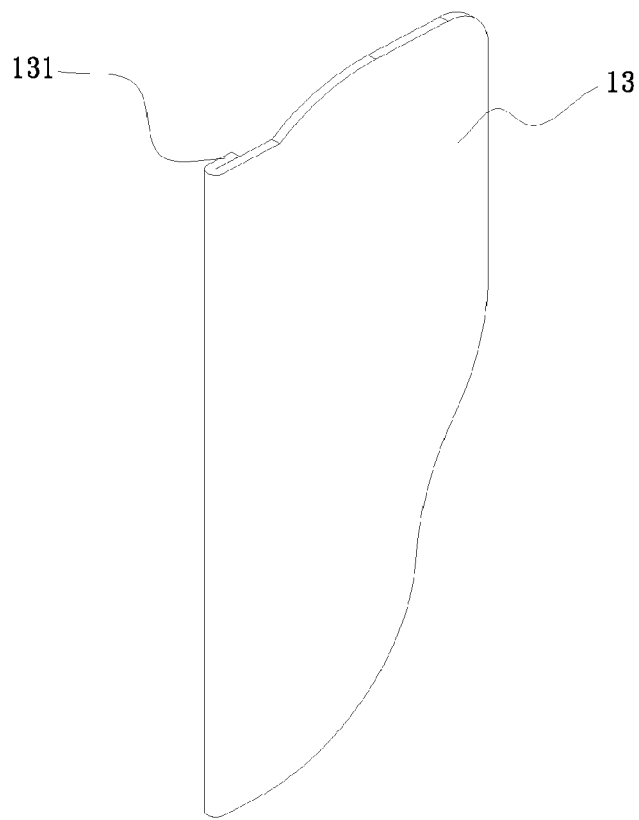
FIG. 3D is a perspective view of the radiating fin of the present invention.

As shown in FIGS. 3C and 3D, the radiating fins 13 are annularly arranged at intervals. Each radiating fin 13 has an end formed with at least one folded root section 131 corresponding to the connection channel 123 (as shown in FIG. 3A).

The folded root section 131 is formed with a thickness f3 by means of back folding or bending (as shown in FIG. 3C). The thickness f3 is slightly larger than the width f1 of the connection channel 123 (as shown in FIG. 3A). Therefore, the folded root section 131 can be thrust into the connection channel 123 from the first end 121 to the second end 122 of the main body 12 in the axial direction a and tightly integrally connected to the connection channel 123 by means of press fit (as shown in FIG. 1).

The folded root section 13 of the radiating fin 13 can be in various forms as described hereinafter.

Figure 4A:
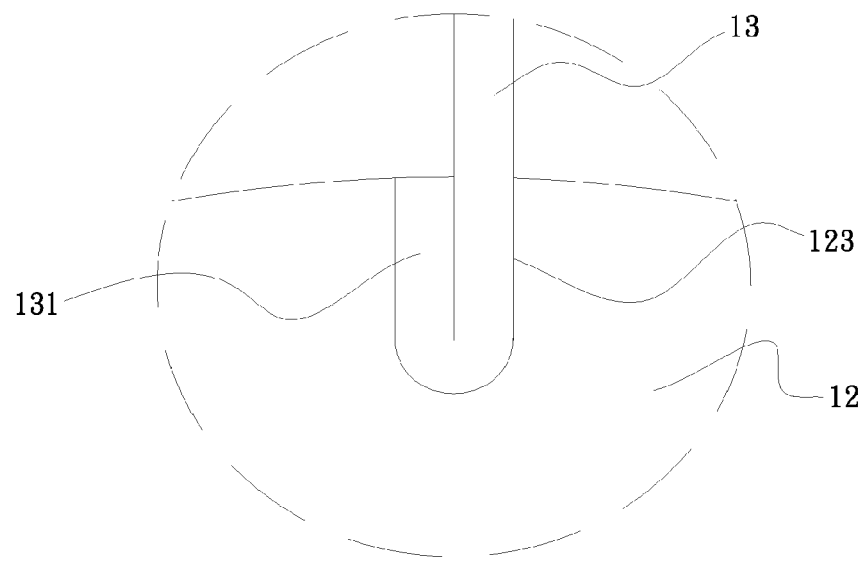
FIG. 4A is a view showing the folded root section of the radiating fin of the present invention in one aspect.
Figure 4B:
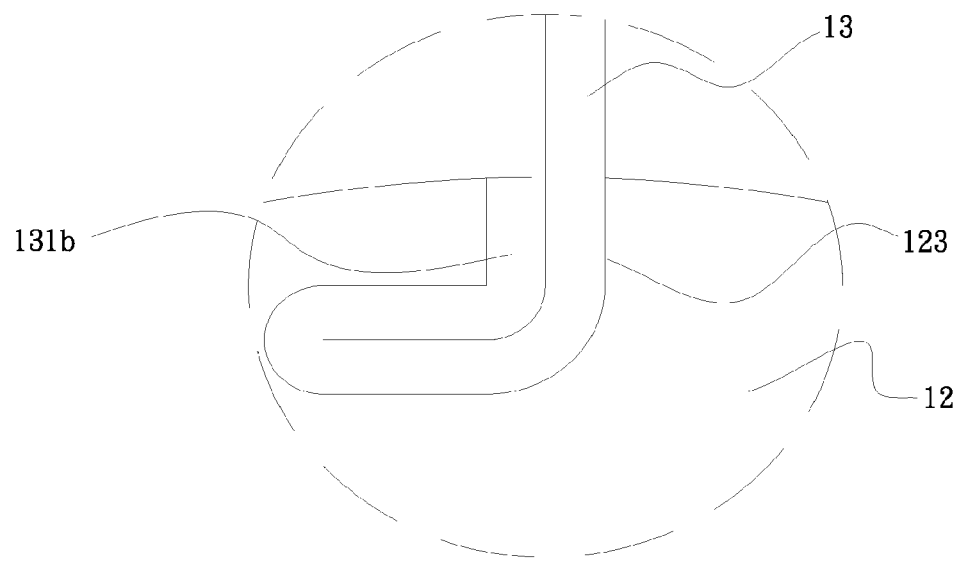
FIG. 4B is a view showing the folded root section of the radiating fin of the present invention in another aspect.
Figure 4C:
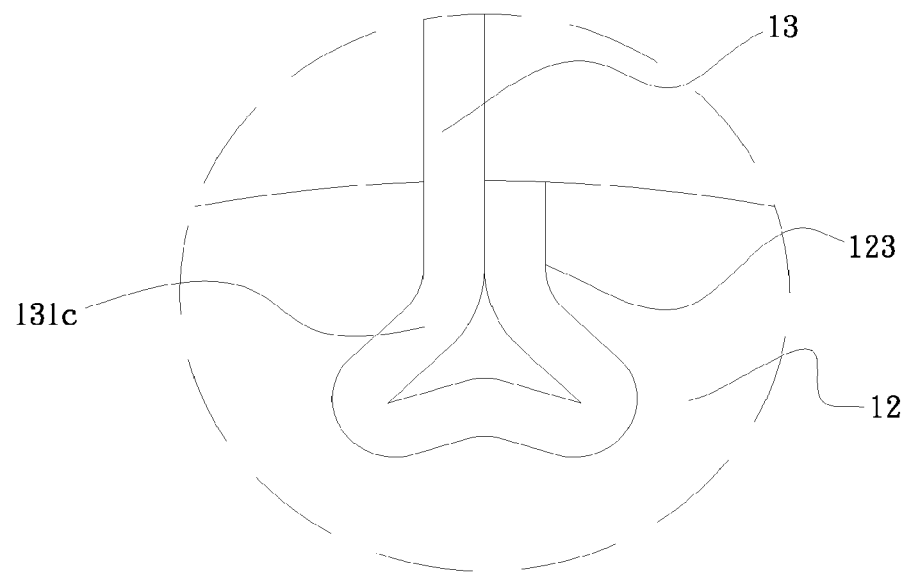
FIG. 4C is a view showing the folded root section of the radiating fin of the present invention in still another aspect.
Figure 4D:
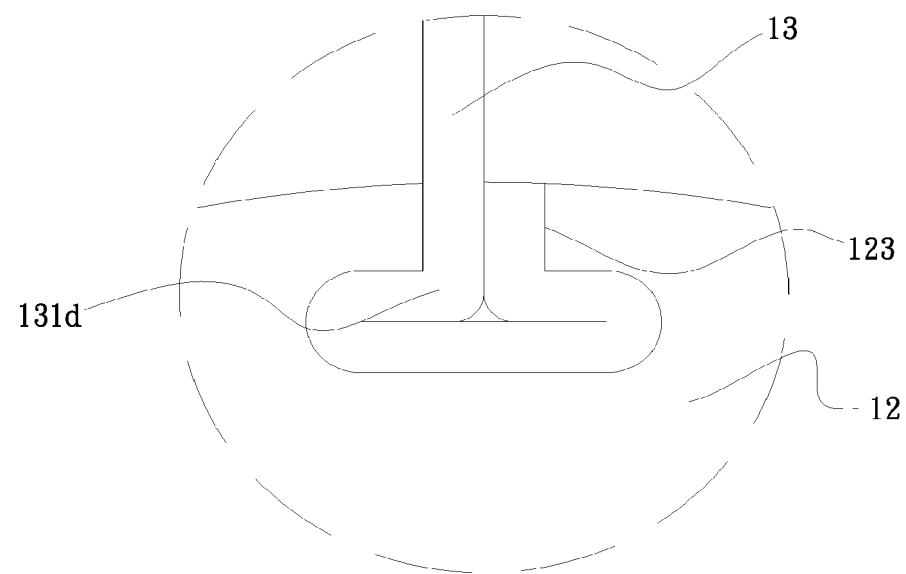
FIG. 4D is a view showing the folded root section of the radiating fin of the present invention in still another aspect.
Figure 4E:
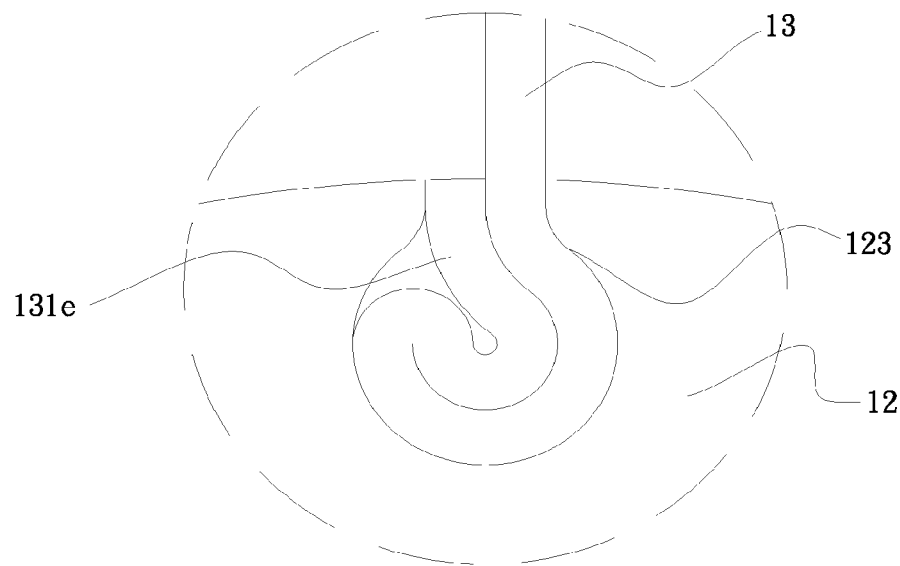
FIG. 4E is a view showing the folded root section of the radiating fin of the present invention in still another aspect.

The form of the folded root section 131 of the end of the radiating fin 13 is variable. For example, as shown in FIG. 4A, the end of the radiating fin 13 is directly folded back onto itself to form the folded root section 131. Alternatively, as shown in FIG. 4B, the end of the radiating fin 13 is directly folded back onto itself and then bent to form an L-shaped folded root section 131b. Still alternatively, as shown in FIG. 4C, the end of the radiating fin 13 is directly folded back onto itself and then pressed to form a triangular folded root section 131c. Still alternatively, as shown in FIG. 4D, the end of the radiating fin 13 is directly folded back onto itself and then pressed to form a reverse T-shaped folded root section 131d. Still alternatively, as shown in FIG. 4E, the end of the radiating fin 13 is directly folded back onto itself and then curled to form a curled folded root section 131e. Still alternatively, the folded root section can have the form of a water drop or a waved form or an overlapping form.

The connection channel 123 of the main body 12 and the radiating fin 13 can be in various forms as described hereinafter.

Figure 5:
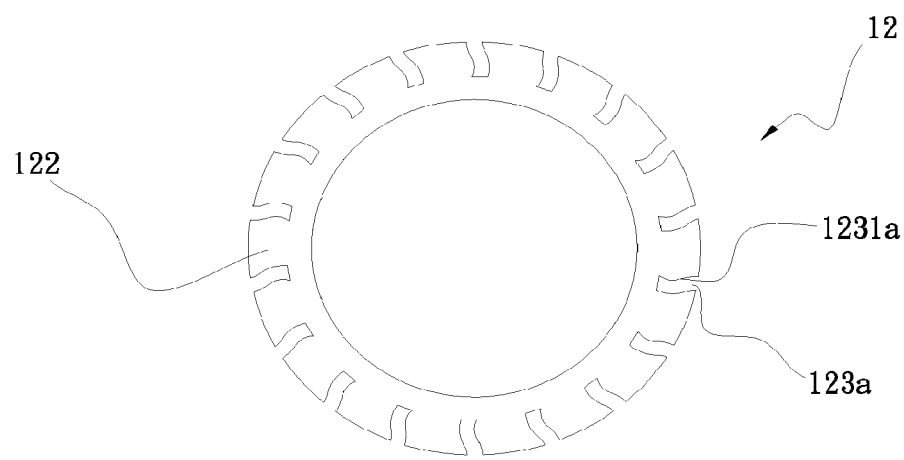
FIG. 5 is a view showing that the connection channel of the main body of the present invention is formed with raised/recessed non-planar surface.

Further referring to FIG. 3A, each connection channel 123 has, but not limited to, a straight surface. Alternatively, as shown in FIG. 5, each connection channel 123a has a raised/recessed non-planar surface 1231a to enhance the connection friction between the connection channel and the folded root section and avoid detachment of the radiating fin.

Figure 6A:
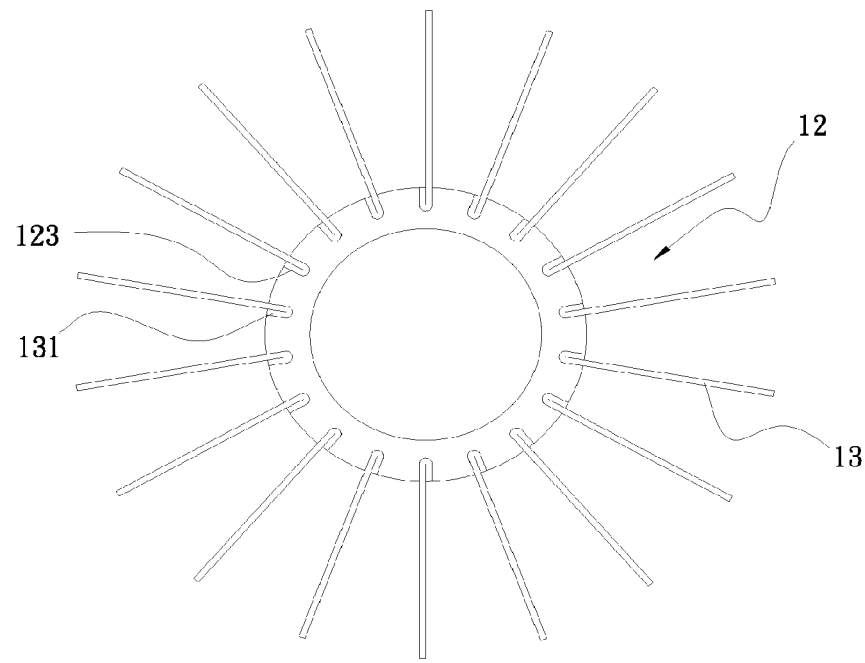
FIG. 6A is a view showing that the folded root section is connected to the connection channel in a first state.
Figure 6B:
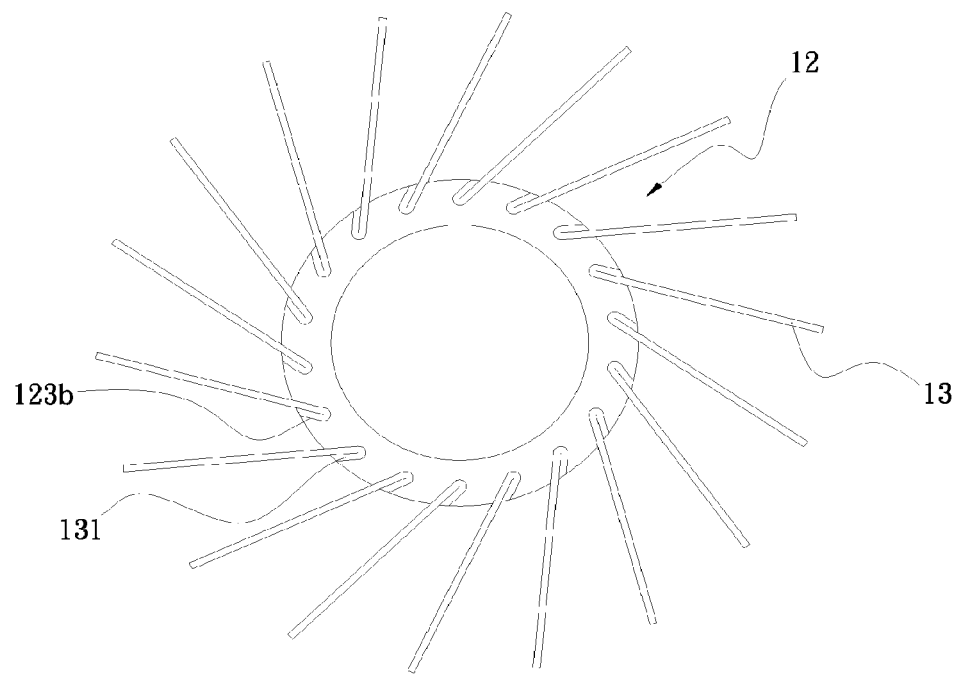
FIG. 6B is a view showing that the folded root section is connected to the connection channel in a second state.

As shown in FIG. 6A, the connection channels 123 are radially distributed over the circumference of the main body 12. The connection channels 123 are normal to the surface of the main body 12. The radiating fin 13 is straight from the folded root section 131 to an outer free end without bending. Alternatively, as shown in FIG. 6B, the connection channels 123b are connection channels radially distributed over the circumference of the main body 12. The connection channels 123b are inclined to the surface of the main body 12. The radiating fin 13 is straight from the folded root section 131 to an outer free end without bending.

Figure 6C:
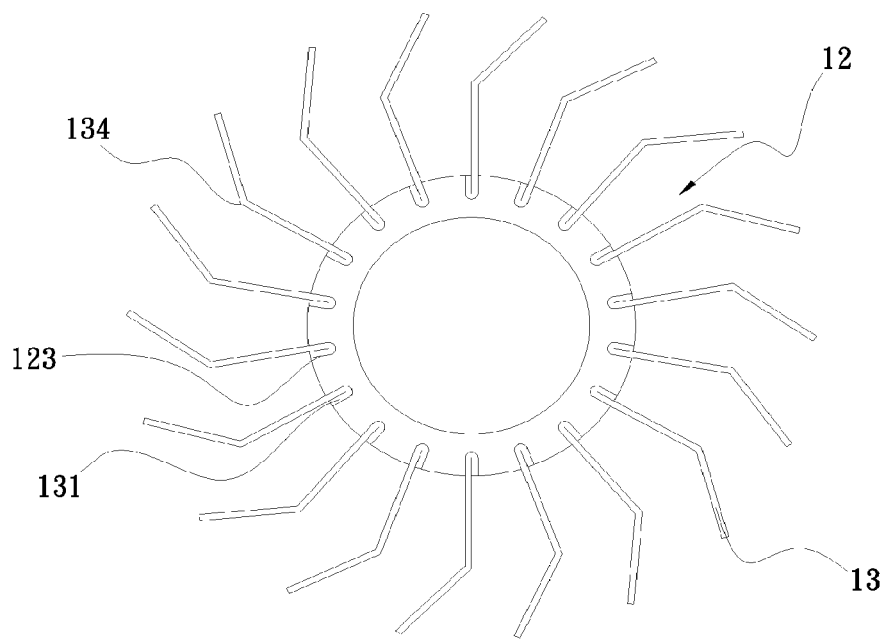
FIG. 6C is a view showing that the folded root section is connected to the connection channel in the first state, in which the radiating fin has a bending angle.
Figure 6D:
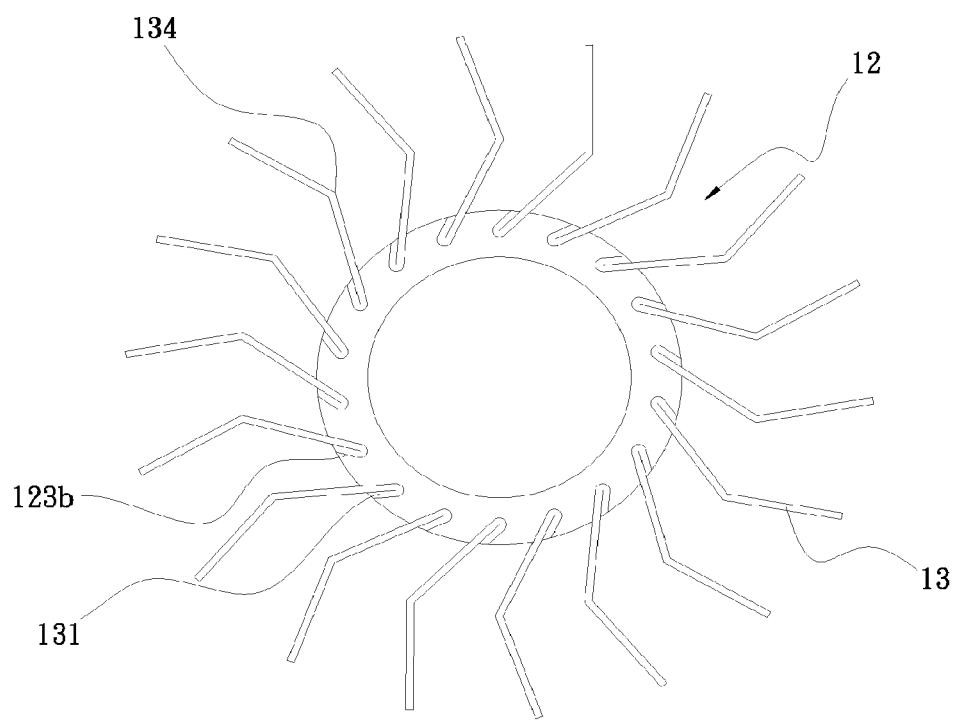
FIG. 6D is a view showing that the folded root section is connected to the connection channel in the second state, in which the radiating fin has a bending angle.

As shown in FIG. 6C and 6D, alternatively, the radiating fin 13 of FIGS. 6A and 6B is formed with a bending angle 134. In the case that the heat sink is used in cooperation with a cooling fan, the fluid passing through the cooling fan is easy to go into the flow ways between the first radiating fins 13 and then quickly flow out to carry away the heat.

Figure 7:
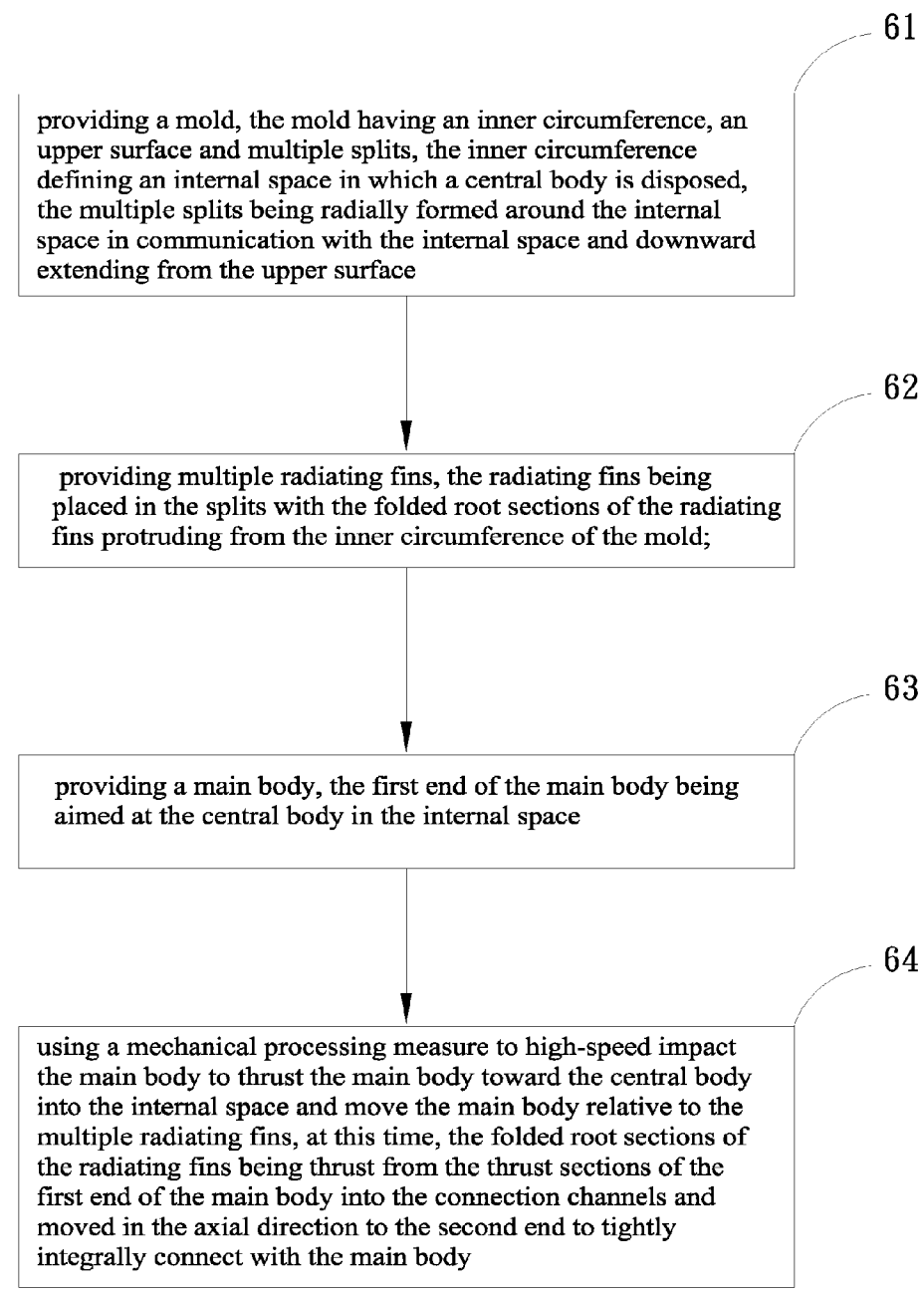
FIG. 7 is a flow chart of the manufacturing method of the present invention.
Figure 8:
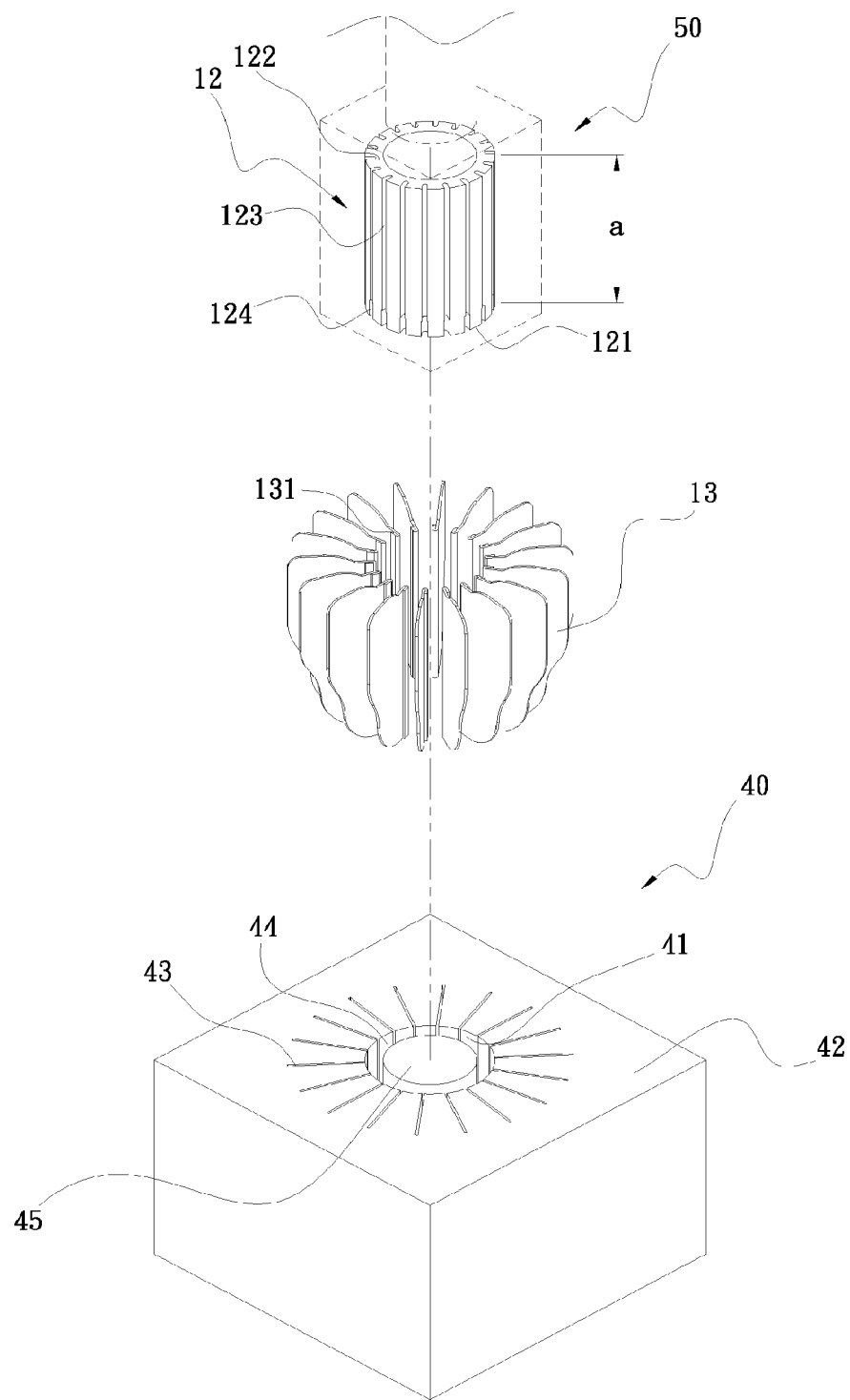
FIG. 8 shows a first step of the manufacturing method of the present invention.
Figure 9A:
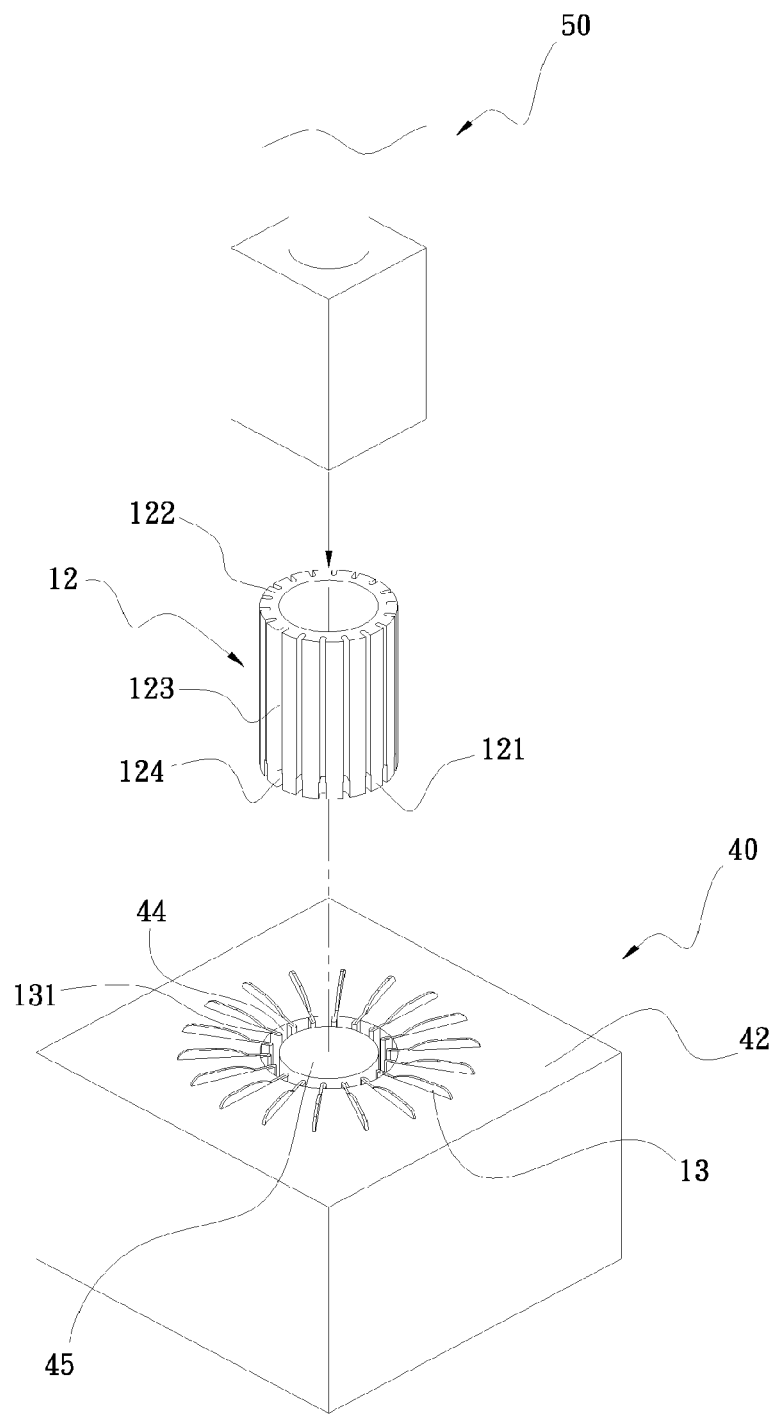
FIG. 9A shows a second step of the manufacturing method of the present invention.
Figure 9B:
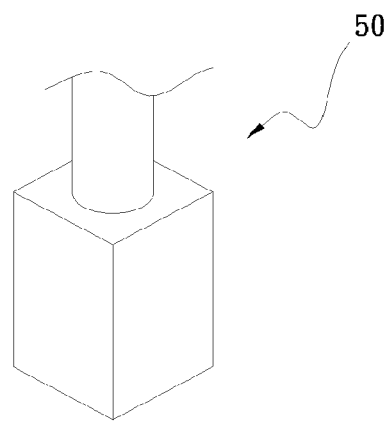
FIG. 9B shows a third step of the manufacturing method of the present invention.
Figure 9B:
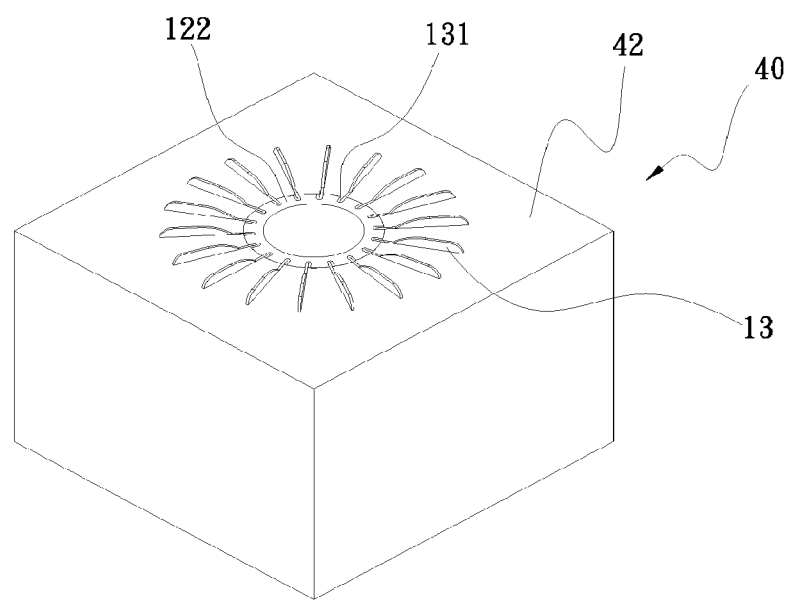

Please further refer to FIGS. 7, 8, 9A and 9B. FIG. 7 is a flow chart of the manufacturing method of the present invention. The manufacturing method of the present invention includes steps of:

Step 61: providing a mold 40 as shown in FIG. 8, the mold 40 having an inner circumference 41, an upper surface 42 and multiple splits 43, the inner circumference 41 defining an internal space 44 in which a central body 45 is disposed, the multiple splits 43 being radially formed around the internal space 44 in communication with the internal space 44 and downward extending from the upper surface 42;

Step 62: providing the multiple radiating fins 13 as shown in FIGS. 8 and 9A, the radiating fins 13 being placed into the splits 43 with the folded root sections 131 protruding from the inner circumference 41 of the mold 40;

Step 63: providing the main body 12 as shown in FIGS. 8 and 9A, the first end 121 of the main body 12 being aimed at the central body 45 disposed in the internal space 44 of the mold 40, the main body 12 being temporarily positioned above the mold 40 with the first end 121 of the main body 12 aimed at the central body 45, the thrust section 124 and the connection channel 123 being aligned with the folded root section 131 of each radiating fin 13; and Step 64: using a mechanical processing measure to high-speed impact the main body 12 as shown in FIGS. 8, 9A and 9B to thrust the main body 12 toward the central body 45 into the internal space 44 and move the main body 12 relative to the multiple radiating fins 13, at this time, the folded root sections 131 of the radiating fins 13 being thrust from the thrust sections 124 of the first end 121 of the main body 12 into the connection channels 123 and moved in the axial direction a to the second end 122 to quickly tightly integrally connect with the main body 12.

In step 64, the mechanical processing measure is an air compression apparatus 50, which serves as a power source for creating compressed air. In the instant of relieving the compressed air, a power is generated to push and drive the main body 12 to thrust into the internal space 44 at high speed. In the meantime, the thrust sections 124 and the connection channels 123 are thrust onto the folded root sections 131 from upper side of the mold 40 at high speed. Accordingly, the main body 12 is integrally connected with the radiating fins 13 to form a heat sink 10 (as shown in FIG. 2). The central body 45 serves to ensure that the main body 12 can be downward thrust into the internal space 44 in correct position along the central body 45. The air compression apparatus 50 is, but not limited to, an air compressor.

Referring to FIG. 2, after step 64 is completed; the heat sink 10 is taken out from the mold 40.

In the above embodiments, the main body 12 is a hollow body. Alternatively, in another embodiment, the main body 12 can be a solid body. In the case that the main body 12 is a solid body, no central body is disposed in the internal space 44 of the mold 40.

The present invention has been described with the above embodiments thereof and it is understood that many changes and modifications in the above embodiments can be carried out without departing from the scope and the spirit of the invention that is intended to be limited only by the appended claims.

What is claimed is:

1. A manufacturing method of a heat sink, comprising steps of:
    providing a mold, the mold having an inner circumference, an upper surface and multiple splits, the inner circumference defining an internal space, the multiple splits being radially formed around the internal space in communication with the internal space and downward extending from the upper surface;
    providing multiple radiating fins, the radiating fins being placed in the splits, one radiating fin being placed in each split, an end of each radiating fin being preformed with a folded root section, the folded root sections protruding from the inner circumference of the mold;
    providing a main body, the main body having a first end and a second end, the first and second ends of the main body defining an axial direction, multiple connection channels being preformed on a circumference of the main body between the first and second ends, the first end of the main body being aimed at the internal space; and
    using a mechanical processing measure to impact the main body so as to thrust the main body into the internal space and move the main body relative to the multiple radiating fins, whereby the folded root sections of the radiating fins are thrust into the connection channels and moved in the axial direction to the second end to press fit and integrally connect the fins with the main body.

2. The manufacturing method of the heat sink as claimed in claim 1, wherein the main body is temporarily positioned above the mold and the mechanical processing measure is an air compression apparatus for creating compressed air to thrust the main body into the internal space.

3. The manufacturing method of the heat sink as claimed in claim 2, wherein a central body is disposed in the internal space in alignment with the main body.

* * * * *